US007840920B2

(12) United States Patent  (10) Patent No.: US 7,840,920 B2
Sugawara  (45) Date of Patent: Nov. 23, 2010

(54) METHOD OF GENERATING TEST PROGRAM FOR OPERATING SEMICONDUCTOR TESTING APPARATUS

(75) Inventor: Yo Sugawara, Nakai-machi (JP)

(73) Assignee: Hitachi High-Tech Engineering Service Corporation, Kanagawa (JP)

( * ) Notice: Subject to any disclaimer, the term of this patent is extended or adjusted under 35 U.S.C. 154(b) by 699 days.

(21) Appl. No.: 11/890,666

(22) Filed: Aug. 6, 2007

(65) Prior Publication Data
US 2008/0040654 A1    Feb. 14, 2008

(30) Foreign Application Priority Data
Aug. 9, 2006  (JP)  ............... 2006-216699

(51) Int. Cl.
*G06F 17/50*  (2006.01)
(52) U.S. Cl. ............................. 716/4; 716/6
(58) Field of Classification Search ............ 716/4, 716/5; 703/13–16; 702/116; 714/728, 738, 714/739
See application file for complete search history.

(56) References Cited

U.S. PATENT DOCUMENTS 6,453,276 B1 * 9/2002 Bauman ................... 703/15

FOREIGN PATENT DOCUMENTS

JP  10-048300  2/1998
JP  2000-187064  7/2000

* cited by examiner

*Primary Examiner*—Vuthe Siek
(74) *Attorney, Agent, or Firm*—J.C. Patents

(57) ABSTRACT

According to the present invention, even a user lacking the knowledge of semiconductor testing apparatus can easily generate a test program, and easily perform alternation and correction of the test program. In the present invention, a microprogram of a spreadsheet software being one of the commonly used application software is used to create the test program. Therefore, even a user lacking the knowledge of semiconductor testing apparatus can easily generate a test program, and easily perform alternation and correction of the test program. When the alternation and the correction of the test program are performed, only setting conditions of each sheet are altered and corrected, and the alternation and the correction of the test program are easily performed.

5 Claims, 14 Drawing Sheets

Test rate set portion
| rate | Input condition | Unit |
|---|---|---|
| t1 | - | ns |
| t2 | - | ns |
| t3 | - | ns |
| t4 | - | ns |
| t5 | - | ns |
| t6 | - | ns |
Category set portion
|  | Program value | Category |
|---|---|---|
| cat | 10 | A |
FIG. 3

Relay set portion

| Input pin voltage set portion (first process portion) | | | | | | vih[V] | | vil[V] | | voh[V] | | vol[V] | | vd[V] | | ioh[μA] | iol[μA] |
|---|---|---|---|---|---|---|---|---|---|---|---|---|---|---|---|---|---|
| Input pin setting | VCC flag | Flag | conn | fmask | fmt | iofmt | Magnification | Value | Magnification | Value | Magnification | Value | Magnification | Value | Magnification | Value | | |
| – | – | – | open | dsb | nrz | input | – | – | – | – | – | – | – | – | – | – | – | – |
| – | – | – | open | dsb | nrz | input | – | – | – | – | – | – | – | – | – | – | – | – |
| – | – | – | open | dsb | nrz | input | – | – | – | – | – | – | – | – | – | – | – | – |
| – | – | – | open | dsb | nrz | input | – | – | – | – | – | – | – | – | – | – | – | – |
| – | – | – | open | dsb | nrz | input | – | – | – | – | – | – | – | – | – | – | – | – |
| – | – | – | open | dsb | nrz | input | – | – | – | – | – | – | – | – | – | – | – | – |
| – | – | – | open | dsb | nrz | input | – | – | – | – | – | – | – | – | – | – | – | – |
| – | – | – | open | dsb | nrz | input | – | – | – | – | – | – | – | – | – | – | – | – |
| – | – | – | open | dsb | nrz | input | – | – | – | – | – | – | – | – | – | – | – | – |
| – | – | – | open | dsb | nrz | input | – | – | – | – | – | – | – | – | – | – | – | – |

Figure 6:
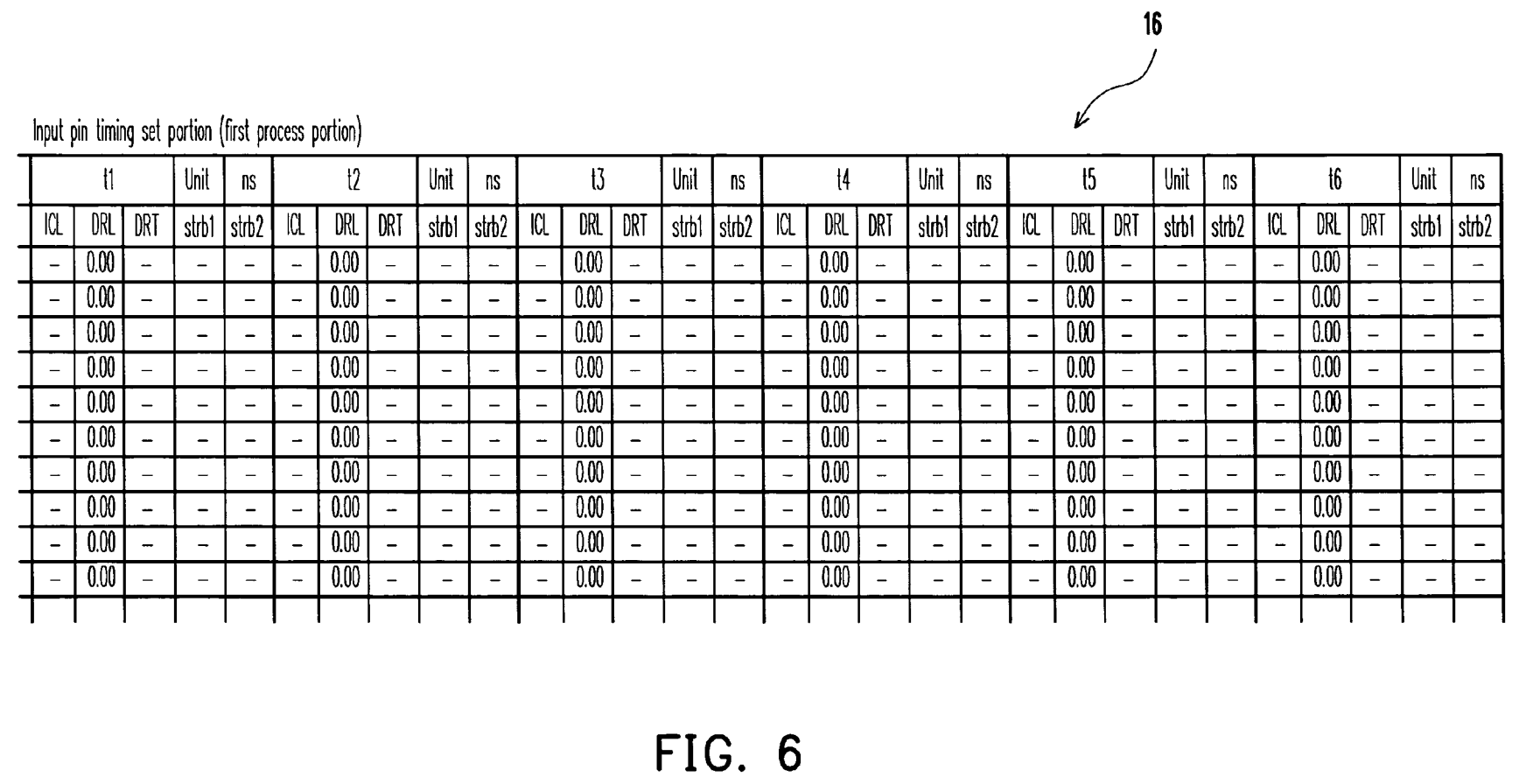

Input pin timing set portion (first process portion) — 16

| | t1 | | | Unit | | | t2 | | | Unit | | | t3 | | | Unit | | | t4 | | | Unit | | | t5 | | | Unit | | | t6 | | | Unit | |
|---|---|---|---|---|---|---|---|---|---|---|---|---|---|---|---|---|---|---|---|---|---|---|---|---|---|---|---|---|---|---|---|---|---|---|---|
| | ICL | DRL | DRT | strb1 | strb2 | ns | ICL | DRL | DRT | strb1 | strb2 | ns | ICL | DRL | DRT | strb1 | strb2 | ns | ICL | DRL | DRT | strb1 | strb2 | ns | ICL | DRL | DRT | strb1 | strb2 | ns | ICL | DRL | DRT | strb1 | strb2 | ns |
| | – | 0.00 | – | – | – | – | – | 0.00 | – | – | – | – | – | 0.00 | – | – | – | – | – | 0.00 | – | – | – | – | – | 0.00 | – | – | – | – | – | 0.00 | – | – | – | – |
| | – | 0.00 | – | – | – | – | – | 0.00 | – | – | – | – | – | 0.00 | – | – | – | – | – | 0.00 | – | – | – | – | – | 0.00 | – | – | – | – | – | 0.00 | – | – | – | – |
| | – | 0.00 | – | – | – | – | – | 0.00 | – | – | – | – | – | 0.00 | – | – | – | – | – | 0.00 | – | – | – | – | – | 0.00 | – | – | – | – | – | 0.00 | – | – | – | – |
| | – | 0.00 | – | – | – | – | – | 0.00 | – | – | – | – | – | 0.00 | – | – | – | – | – | 0.00 | – | – | – | – | – | 0.00 | – | – | – | – | – | 0.00 | – | – | – | – |
| | – | 0.00 | – | – | – | – | – | 0.00 | – | – | – | – | – | 0.00 | – | – | – | – | – | 0.00 | – | – | – | – | – | 0.00 | – | – | – | – | – | 0.00 | – | – | – | – |
| | – | 0.00 | – | – | – | – | – | 0.00 | – | – | – | – | – | 0.00 | – | – | – | – | – | 0.00 | – | – | – | – | – | 0.00 | – | – | – | – | – | 0.00 | – | – | – | – |
| | – | 0.00 | – | – | – | – | – | 0.00 | – | – | – | – | – | 0.00 | – | – | – | – | – | 0.00 | – | – | – | – | – | 0.00 | – | – | – | – | – | 0.00 | – | – | – | – |

LCD set portion — lcdstrb set portion

| rng | lcdrly | vt[V] | ioh[μA] | iol[μA] | t1 ns | t2 ns | t3 ns | t4 ns | t5 ns | t6 ns |
|---|---|---|---|---|---|---|---|---|---|---|
| off | off | - | - | - | - | - | - | - | - | - |

Output pin set portion

| LCD pin setting | conn | fmask | voh[V] | vol[V] |
|---|---|---|---|---|
| - | open | dsb | - | - |
| - | open | dsb | - | - |
| - | open | dsb | - | - |
| - | open | dsb | - | - |
| - | open | dsb | - | - |

IOVCC magnification set portion
20
| | VIH1 | VIL1 | VOH1 | VOL1 | VT1 |
|---|---|---|---|---|---|
| IOVCC | 1.00 | 0.00 | 0.70 | 0.30 | 0.50 |
21
VCC magnification set portion
| | VIH2 | VIL2 | VOH2 | VOL2 | VT2 |
|---|---|---|---|---|---|
| VCC | 1.00 | 0.00 | – | – | – |
22
VDD set portion
| | VIH3 | VIL3 | VOH3 | VOL3 | VT3 |
|---|---|---|---|---|---|
| VDD | – | – | – | – | – |
FIG. 9

| Pattern set portion (second process portion) | | | | | | | | | | | | | | |
|---|---|---|---|---|---|---|---|---|---|---|---|---|---|---|
| Test number | | | | | | | | | | | | | | |
| Used pattern | – | – | – | – | – | – | – | – | – | – | – | – | – | – |
| Start | seq | – | – | – | – | – | – | – | – | – | – | – | – | – |
| Stop | – | – | – | – | – | – | – | – | – | – | – | – | – | – |
| Operation mode (seq/para) | – | seq | seq | seq | seq | seq | seq | seq | seq | seq | seq | seq | seq | seq |
| Test pattern condition | – | – | – | – | – | – | – | – | – | – | – | – | – | – |

| Power source sequence set portion | | | | |
|---|---|---|---|---|
| | Terminal name | | | |
| Time | uvi | rvi | pin | LCD |
| 2 | – | – | – | – |
| 2 | – | – | – | – |
| 2 | – | – | – | – |
| 2 | – | – | – | – |
| 2 | – | – | – | – |
| 2 | – | – | – | – |
| 2 | – | – | – | – |
| 1 | | | | |

METHOD OF GENERATING TEST PROGRAM FOR OPERATING SEMICONDUCTOR TESTING APPARATUS

CROSS-REFERENCE TO RELATED APPLICATION

This application claims the priority benefit of Japan application serial no. JP2006-216699, filed on Aug. 9, 2006. All disclosure of the Japan application is incorporated herein by reference.

BACKGROUND OF THE INVENTION

1. Field of the Invention

The present invention relates to a method of generating test program, for operating a semiconductor testing apparatus. More particularly, the present invention relates to a method of generating test program for a semiconductor testing apparatus, wherein the test program is easily generated even by an individual who is unknowledgeable of a semiconductor testing apparatus.

2. Description of Related Art

In order to provide semiconductor devices with assured performance and quality to the market, it is necessary to inspect the electrical characteristics of all or a part of the semiconductor devices at each working procedure of the manufacturing department and the inspecting department. The electrical characteristics of a semiconductor testing apparatus are inspected as follows. Data in a specific pattern for testing the semiconductor device is inputted to a semiconductor device, an output data of the semiconductor device is read. If there are problems with the basic operations and functions of the semiconductor device being tested, fail information is analyzed, and the electrical characteristics are inspected according to the output data of the semiconductor device being tested.

In order to perform the inspection, it is necessary to generate a test program to be executed in the semiconductor testing apparatus in each semiconductor device. When a diversity of semiconductor testing apparatus is provided, it is necessary to generate a test program for each model. Usually, the test program includes pin grouping information and test item processing sequence etc. of the semiconductor device to be tested.

The apparatus for generating the test program, such as creating a test program as shown in Japanese Laid-Open Patent Publication No. H10-48300, is well known. In the method of creating a test program, by inputting individual data, the grouping of the test object pin or other semiconductor device individual information are input into the form of the test program, so as to create a individual test program of the semiconductor device.

Further, a test group creation apparatus and a creation system thereof as shown in Japanese Laid-Open Patent Publication No. 2000-187064 are well known. The test group creation apparatus and a creation system thereof relate to a method of grouping test object pins of the semiconductor device, in which the pin grouping condition is defined, so as to correspond to more complicated condition, i.e., the conditions that the semiconductor device is complicated and the number of the pins is increased, thereby accurately creating the test group in a short time.

The situations of the prior art have the following problems. The test item becomes complicated when the semiconductor device is complicated. When the test items in one semiconductor device are different from those in other semiconductor device, it is necessary to create a test program for each semiconductor device. Hence, the generation of a test program is labor intensive and time consuming. Further, it is necessary to perform adjustment and alternation on the generated test programs manually. Accordingly, the user must be professionally knowledgeable of each semiconductor device. Further, the adjustment and the alternation are performed manually in the prior art. Hence, during the program alternation and revision are being performed, human errors may be introduced. Since the alternation and revision are manually performed, the test specification and the test program cannot respectively correspond with each other. In this case, in order to provide the test specification and the test program to correspond with each other, a reverse conversion from the test program to the test specification is required. When the reverse conversion construction does not exist, after the generated program is altered, it is impossible to return to the test specification. Further, the following problem exists, namely, a lot of time is required for the generation of a test program, which includes the implementation or the analysis of the test program, created by others due to different demands for different individuals.

SUMMARY OF THE INVENTION

Accordingly, the present invention is directed to provide a method of generating a test program, wherein the test program is easily generated even by an individual who is not knowledgeable of a semiconductor testing apparatus, and alternation and correction of the test program can easily perform.

In one aspect of the present, the present invention provides a method of generating a test program for operating a semiconductor testing apparatus. Each test item has a plurality of sheets of a spreadsheet including a format used to input the test condition. When the test program is generated, a specified sheet is selected from a plurality of sheets, then a specified setting condition is input into the selected sheet format, and a macro program of the spreadsheet is executed, so as to generate the specified test program.

In the method, the microprogram of the spreadsheet being one of the commonly used application software is used to create the test program. Therefore, even a user, lacking knowledge of the semiconductor testing apparatus, can easily generate the test program. When the alternation and the correction of the test program are performed, only the setting condition of each sheet is required to be altered and corrected. Hence, it is easy to perform the alternation and the correction of the test program.

In the method of generating a test program of the present invention, the plurality of sheets is created according to a prepared basic sheet. In the method, each sheet formation corresponding to each test item is generated according to the basic sheet, so the formation of other test items is easily comprehensible by understanding solely the basic sheet.

In the method of generating a test program of the present invention, MICROSOFTEXCEL® is used as the spreadsheet. In the method, the commonly used MICROSOFTEXCEL® is used as the spreadsheet.

In the method of generating a test program of the present invention, the test program generated by executing the macroprogram is displayed on another sheet of the spreadsheet. In the method, the test program generated by executing the macroprogram is displayed on the sheet of the same spreadsheet. Therefore, the operation becomes simple.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a detailed schematic view of a test rate set portion and a category set portion of FIG. 1.

FIG. 5 is a detailed schematic view of an input pin voltage set portion (a first process portion/a first care portion) of FIG. 1.

FIG. 6 is a detailed schematic view of an input pin timing set portion (the first process portion) of FIG. 1.

FIG. 9 is a detailed schematic view of an IOVCC (input and output supply voltage) magnification set portion, a VCC (supply voltage) magnification set portion, and a VDD (operating voltage) set portion.

FIG. 10 is a detailed schematic view of a pattern set portion (the first process portion) of FIG. 1.

FIG. 12 is a detailed schematic view of a power source sequence set portion of FIG. 1.

FIG. 15 is a schematic view of an example of the program sheet; the program sheet shows an example of the test program after the executing button in the program-generating sheet is clicked during the open test of FIG. 13.

DESCRIPTION OF EMBODIMENTS

Figure 1:
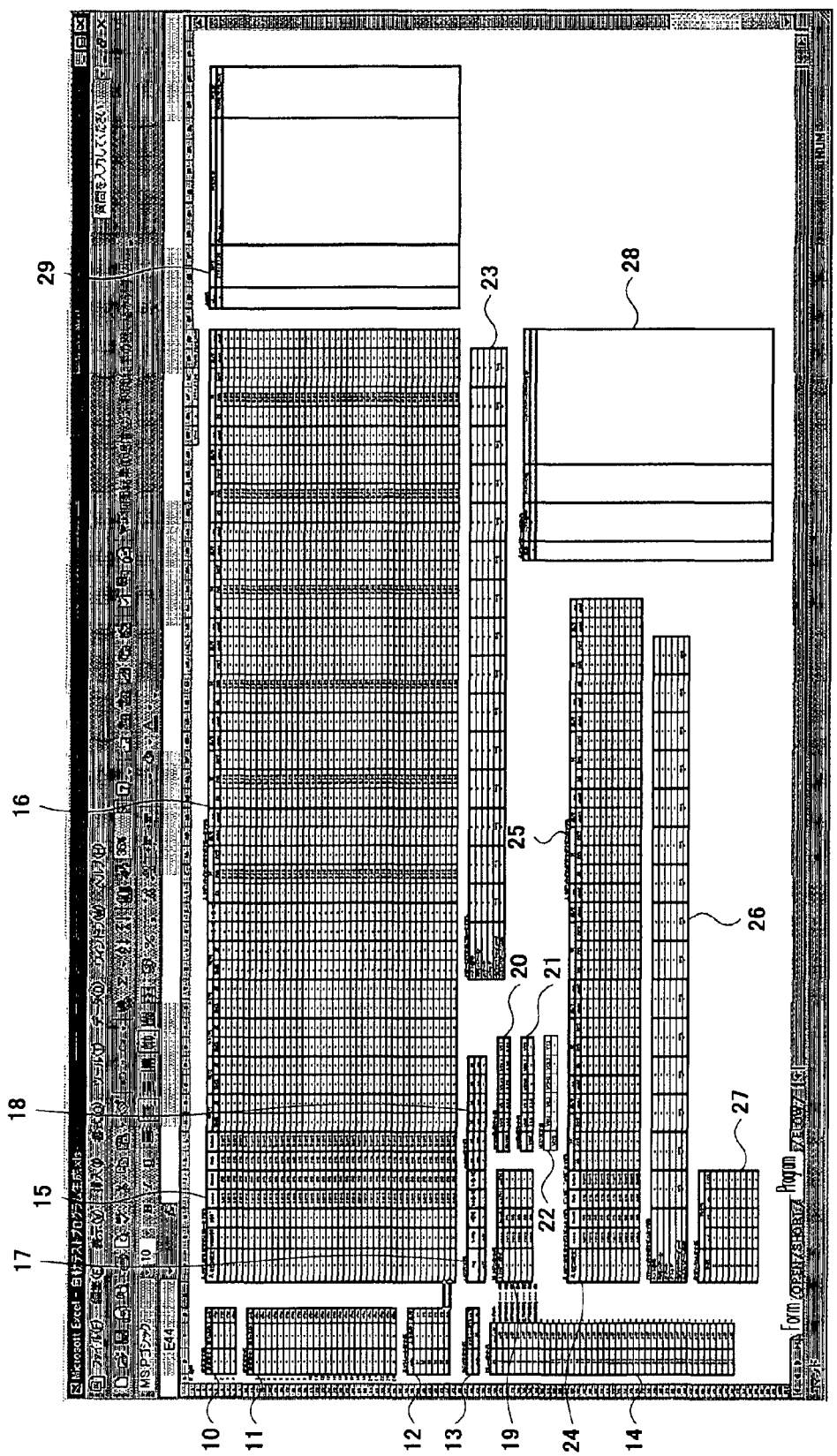
FIG. 1 is a schematic view showing the method of generating a test program according to an embodiment of the present invention.

An embodiment of the present invention is illustrated with the drawings. FIG. 1 is a schematic view of a prepared basic (form) sheet applied in the method of generating a test program according to an embodiment of the present invention. In this embodiment, an example for constructing a system, for generating the test program in the application software MICROSOFT EXCEL®, is presented.

The basic sheet of FIG. 1 includes a first power source set portion 10, a second power source set portion 11, a test rate set portion 12, a category set portion 13, a relay set portion 14, an input pin voltage set portion (a first process portion) 15, an input pin timing set portion (the first process portion) 16, an LCD set portion 17, an lodstrb set portion 18, an output pin set portion 19, an IOVCC magnification set portion 20, a VCC magnification set portion 21, a VDD set portion 22, a pattern set portion (the first process portion) 23, an input pin voltage set portion (a second process portion) 24, an input pin timing set portion (the second process portion) 25, a pattern set portion (the second process portion) 26, a power source sequence set portion 27, a test pattern condition sheet 28, and an history sheet 29.

Figure 2:
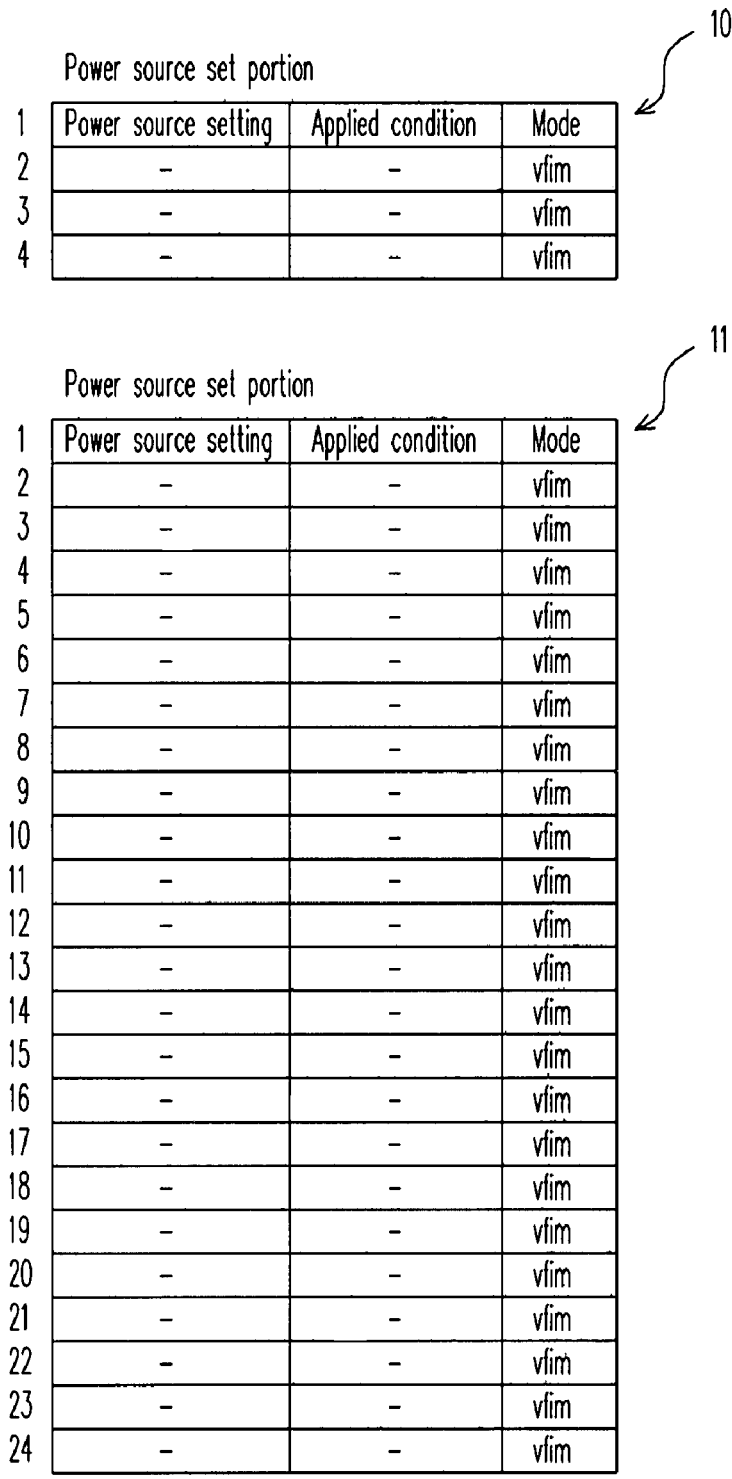
FIG. 2 is a detailed schematic view of a first power source set portion and a second power source set portion of FIG. 1.

FIG. 2 is a detailed schematic view of the first power source set portion 10 and the second power source set portion 11 of FIG. 1. The first power source set portion 10 includes 3 columns of set items and 4 rows of input items, the 3 columns of set items are power source setting, applied condition, and mode. Similarly, the second power source set portion 11 includes 3 columns of set items, and 24 rows of input items, the 3 columns of set items are power source setting, applied condition, and mode. In the set item "power source setting", pin names such as VCC and IOVCC are input. In the set item "applied condition", the setting conditions of voltage are input with the unit [V]. In the set item "mode", vfim mode or ifvm mode is selectively set.

FIG. 3 is a detailed schematic view of the test rate set portion 12 and the category set portion 13 of FIG. 1. The test rate set portion 12 includes 3 columns of set items, and 6 rows of input items respectively corresponding to rates rt1-rt6. The 3 columns of set items are rate, input condition, and unit. The values respectively corresponding to the rates rt1-rt6 are input into the set item "input condition". In the set item "unit", [ns], [μs], and [ms] are selectively set as the unit of the test rate. The category set portion 13 includes the following 3 columns of set items, namely, letter, program value, and category representing "cat" of the category set portion. The category setting is fixed in each test, so it is not necessary to perform the setting.

Figure 4:
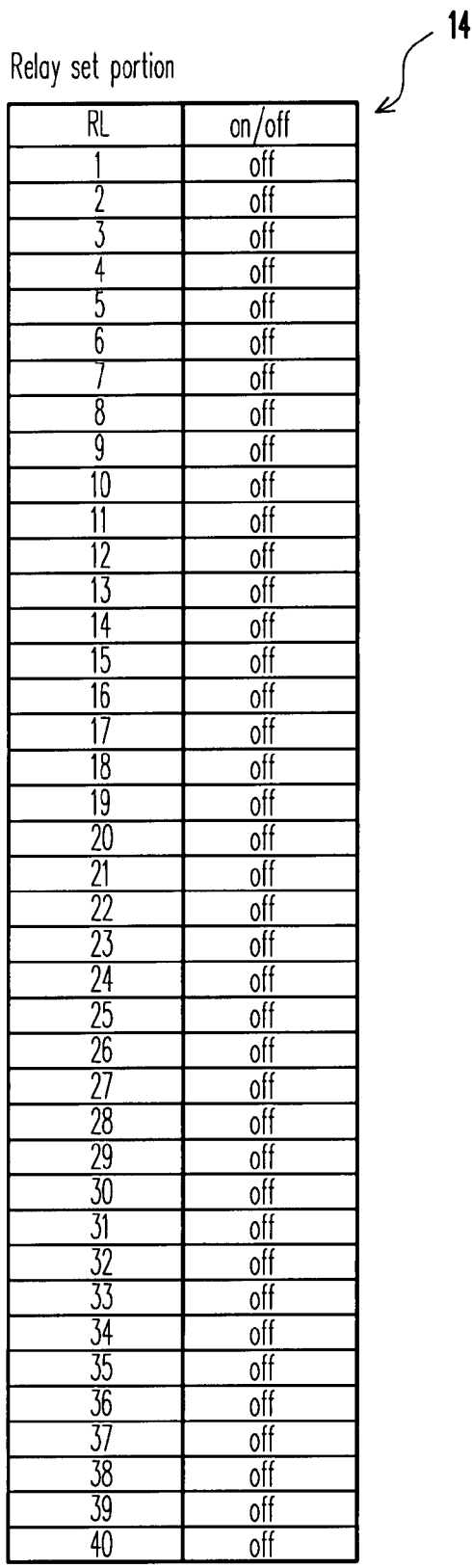
FIG. 4 is a detailed schematic view of a relay set portion of FIG. 1.

FIG. 4 is a detailed schematic view of the relay set portion 14 of FIG. 1. The relay set portion 14 performs setting on a load relay, sets a load relay number, and turns a load relay on/off. The load relay number prepares 40 rows of input items. The used load relay instruction can be record on the right side of the on/off column.

FIG. 5 is a detailed schematic view of the input pin voltage set portion (the first process portion) 15 of FIG. 1. The input pin voltage set portion (the first process portion) 15 includes various set items and 40 rows of input items. The various set items include input pin setting, VCC flag, flag, conn, fmask, fmt, iofmt, vih[V], vil[V], voh[V], vol[V], vt[V], ioh[μA], and iol[μA]. In the set item "input pin setting", the pin names defined by DDF file are set. In the set item "VCC flag", the power source modes (IVOCC, VCC, and VDD) of each terminal are set. In the set item "conn", connecting objects (fc, open, svi, and pmu) of each terminal are set. In the set item "fmask", fail masks (dsb and enb) are set. In the set item "fmt", waveform formats (nrz, rl, rz, fixh, fixh, and sbc) are set. In the set item "iofmt", IO formats (input, output, and nrz) are set. In the set items "vih[V], vil[V], voh[V], vol[V], vt[V], ioh[μA], and iol[μA]", after the set item "VCC flag" is set, the magnification is automatically set. When the IOVCC and VCC magnification set portions are not yet being set, the set items are indicated as "-". In the numerical value column, the calculation result with the magnification is set. In addition, when using direct values (directly using a keyboard and etc. to input the numerical values), the values are directly input into the "value" column.

FIG. 6 is a detailed schematic view of the input pin timing set portion (the first process portion) 16 of FIG. 1. The input pin timing set portion (the first process portion) 16 includes the first to the sixth timings (tt1-tt6), items setting the timing units, and 40 rows of input items. In various timings (tt1-tt6), set items ICL, DRL, DRT, strb1, and strb2 are set. In the set item "ICL", when a waveform format is "sbc", the numerical value is set as the reversing edge. When the waveform format is other formats besides the "sbc" or when outputting the pin information rather than inputting the pin information, the item "ICL" is set to be "-". In the set item "DRL", the value of a rising edge is set. When the waveform format is "fixh", and "fixl", the item "DRL" is set to be (0.0 ns). In the DRT item, the numerical value of a falling edge is set. When the waveform format is "fixh", and "fixl", it is set to be "-". In the set item "strb1" and "strb2", the value of strobing is set. For the usual strobing, only "STRB1" is set, and for windows strobing, it is necessary to set "STRB2". Under an unrecorded situation, the items "strb1" and "strb2" are set to be "-". In the set item "unit", any unit of ns and µs is set.

Figure 7:
FIG. 7 is a detailed schematic view of an LCD set portion and a lodstrb set portion of FIG. 1.

FIG. 7 is a detailed schematic view of the LCD set portion 17 and the lodstrb set portion 18 of FIG. 1. The LCD set portion 17 includes the following set items, namely, mg, lcdrly, vt[V], ioh[µA], and iol[µA]. In the set item "mg", off, lv, and hv are set as the scope of the LCD pin. In the set item "lcdrly", on and off of the output relay of the LCD pin are set. In the set item "vt[V]", VT of the LCD pin is set as unit [V]. In the set item "ioh[µA], and iol [µA]", the current value of the LCD pin is used as unit [µA]. The lodstrb set portion 18 includes the following set items, namely the strobing of the LCD pins corresponding to various timings (tt1-tt6). Each timing (tt1-tt6) has the unit set portion.

Figure 8:
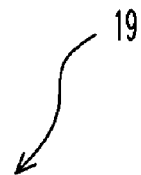
FIG. 8 is a detailed schematic view of an output pin set portion of FIG. 1.

FIG. 8 is a detailed schematic view of the output pin set portion 19 of FIG. 1. The output pin set portion 19 includes the following set items, namely LCD pin setting, conn, fmask, voh[V], and vol[V]. In the set item "LCD pin setting", the pin names defined by the DDF file are set. In the set item "conn", open, ald, and pmu are set as the connecting objects of each terminal. In the set item "fmask", dsb and enb are used for the fail mask. In the set item "voh[V]" and "vol[V]", the voltage value is set as unit [V].

FIG. 9 is a detailed schematic view of the IOVCC magnification set portion 20, the VCC magnification set portion 21, and the VDD set portion 22 of FIG. 1. The IOVCC magnification set portion 20 includes the following set items, namely VIH1, VIL1, VOH1, VOL1, and VT1. The VDD set portion 21 includes the following set items, namely VIH2, VIL2, VOH2, VOL2, and VT2. In each set item, the magnification of each DC characteristic is set. The set value and the VCC flag are used to set the voltage of the input terminal.

FIG. 10 is a detailed schematic view of the pattern set portion (the first process portion) 23 of FIG. 1. The pattern set portion (the first process portion) 23 includes the following set items, namely test number, used pattern, start, end, operation mode (seq/para), and test pattern condition. In the set item "test number", the test number is set. In the set item "used pattern", the used pattern name is set. In the set item "start", and "end", the start and end marks recorded in the used pattern are set. In the set item "operation mode (seq/para)", any one of (seq/para) is set as the operation mode of the used pattern. In the set item "test pattern condition", the number corresponding to the test pattern condition sheet is set. In addition, during automatic generation, each set item is not used, but it is necessary to record when it is affirmed that the terminal is set.

Figure 11:
FIG. 11 is a detailed schematic view of an input pin voltage set portion (a second process portion/a second care portion) and an input pin timing set portion (the second process portion) of FIG. 1.

FIG. 11 is a detailed schematic view of the input pin voltage set portion (the second process portion) 24 and the input pin timing set portion (the second process portion) 25 of FIG. 1. The input pin voltage set portion (the second process portion) 24 and the input pin timing set portion (the second process portion) 25 are the same as the input pin voltage set portion (the first process portion) 15 and the input pin timing set portion (the first process portion) 16 of FIGS. 5 and 6, except that the numbers of the input items are different. In addition, the pattern set portion (the second process portion) 26 is the same as the pattern set portion (the first process portion) 23 of FIG. 10, so it is not shown.

FIG. 12 is a detailed schematic view of the power source sequence set portion 27 of FIG. 1. The power source sequence set portion 27 includes the following set items, namely time and terminal name. In the set item "time", the time of "sr" sequence is set with the unit [ms]. The set item "terminal name" includes the following items, namely "uvi", "rvi", "pin", and LCD. In the items "uvi" and "rvi", the terminal names are set, in the item "LCD", lcd relative to the LCD portion is set. Under the unrecorded situation, item "LCD" is set to be "-".

In addition, the test pattern condition sheet 28 and the history sheet 29 are not shown in detail, but in the test pattern condition sheet 28, the condition contents corresponding to various tests are set; for example, the setting condition number, the test number, and the pattern name. The condition contents are set to confirm the pattern set portion. In the history sheet 29, the history of the test condition sheet is set.

Figure 13:
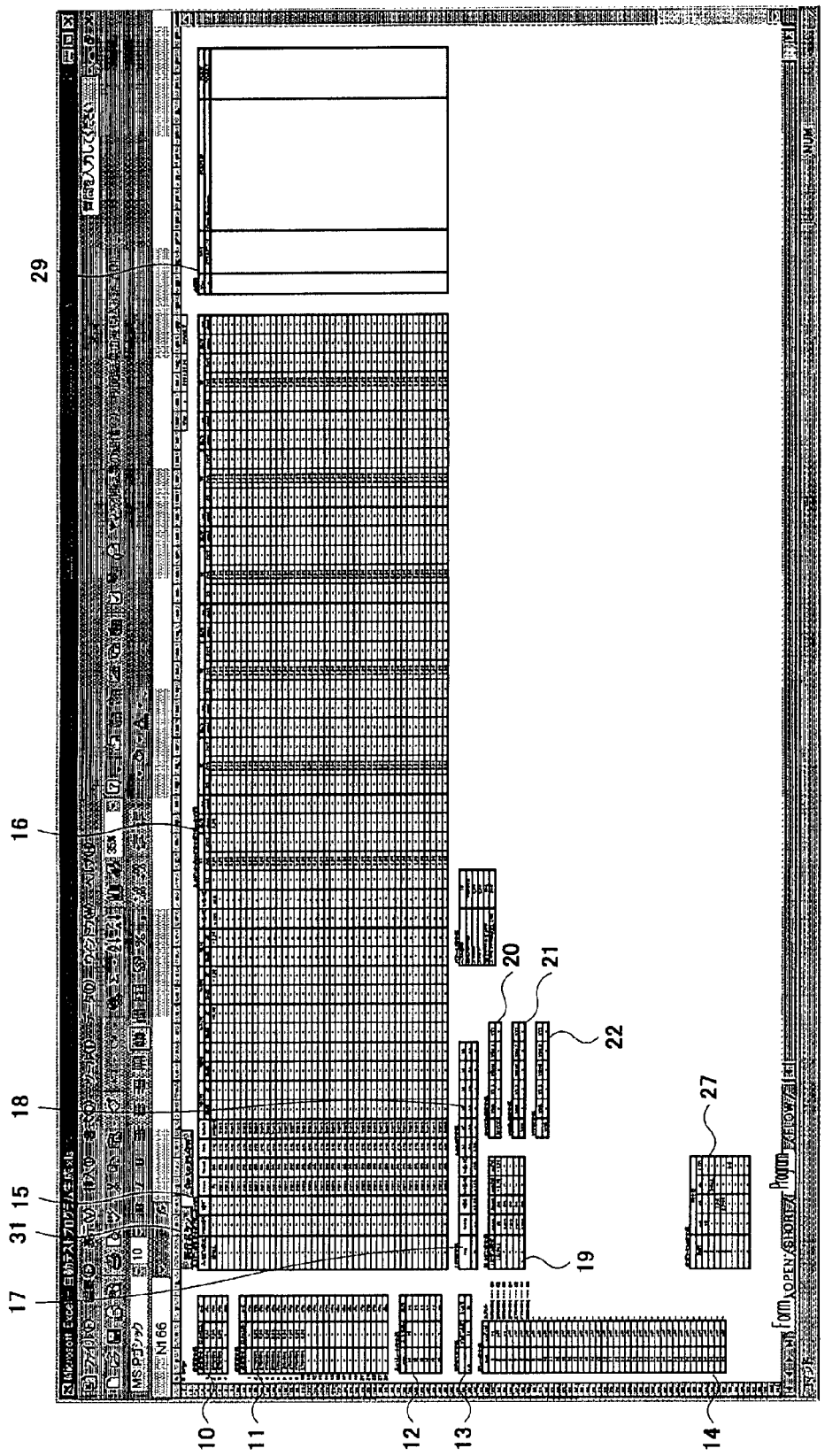
FIG. 13 is a schematic view of an example of using the basic sheet of FIG. 1 to create the open test.

FIG. 13 is a schematic view of an example of using the basic sheet of FIG. 1 to generate the open test. It is understood from the figure that when the open test is performed, the following portions in the basic sheet of FIG. 1 are directly used to form the test sheet, namely the power source set portion 10, the second power source set portion 11, the test rate set portion 12, the category set portion 13, the relay set portion 14, the input pin voltage set portion (the first process portion) 15, the input pin timing set portion (the first process portion) 16, the LCD set portion 17, the lodstrb set portion 18, the output pin set portion 19, the IOVCC set portion 20, the VCC magnification set portion 21, the VDD set portion 22, the power source sequence set portion 27, and the history sheet 29. The specified numerical values or letters are input into each item of the test sheet, an executing button 31 on the upper left side is operated; therefore, the macro language (VBA) of MICROSOFT EXCEL® is executed to output the test program into the program sheet.

Figure 14:
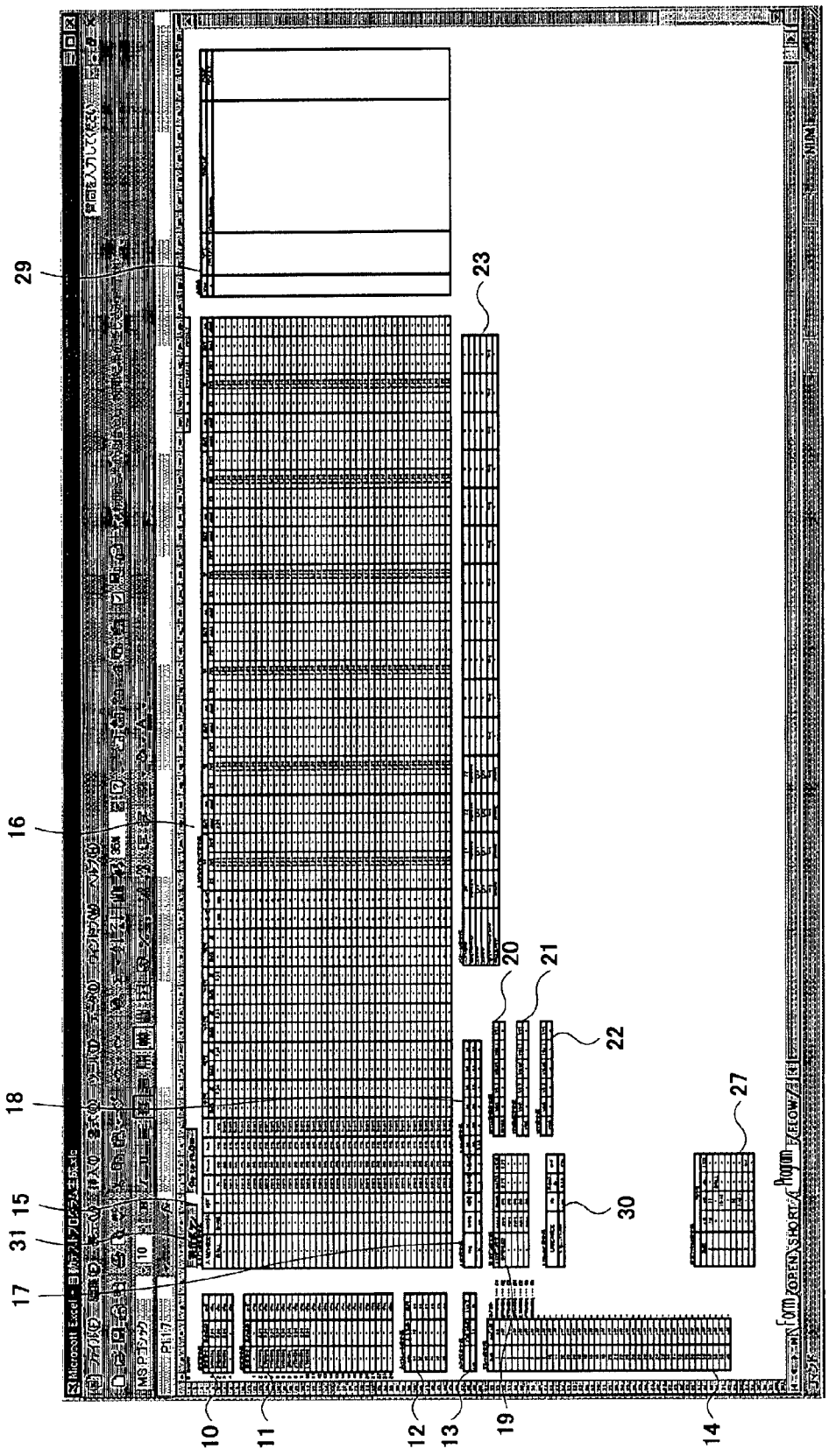
FIG. 14 is a schematic view of an example of using the basic sheet of FIG. 1 to create the short test.

FIG. 14 is a schematic view of an example of using the basic sheet of FIG. 1 in generating the short test. It is understood from the figure that when the short test is performed, the following portions in the basic sheet of FIG. 1 are directly used, namely the power source set portion 10, the second power source set portion 11, the test rate set portion 12, the category set portion 13, the relay set portion 14, the input pin voltage set portion (the first process portion) 15, the input pin timing set portion (the first process portion) 16, the LCD set portion 17, the lodstrb set portion 18, the output pin set portion 19, the IOVCC set portion 20, the VCC magnification set portion 21, the VDD set portion 22, the power source sequence set portion 27, and the history sheet 29. Further, an LCD-DC set portion 30 is added. The LCD-DC set portion 30 includes the following set items, namely LCD pin setting, rly, applied condition, and mode, and the detailed descriptions thereof are omitted. The specified numerical values or letters are input into each item of the test sheet, the executing button 31 on the upper left side is operated; therefore, the VBA of MICROSOFT EXCEL® is executed to output the test program into the program sheet.

Figure 15:
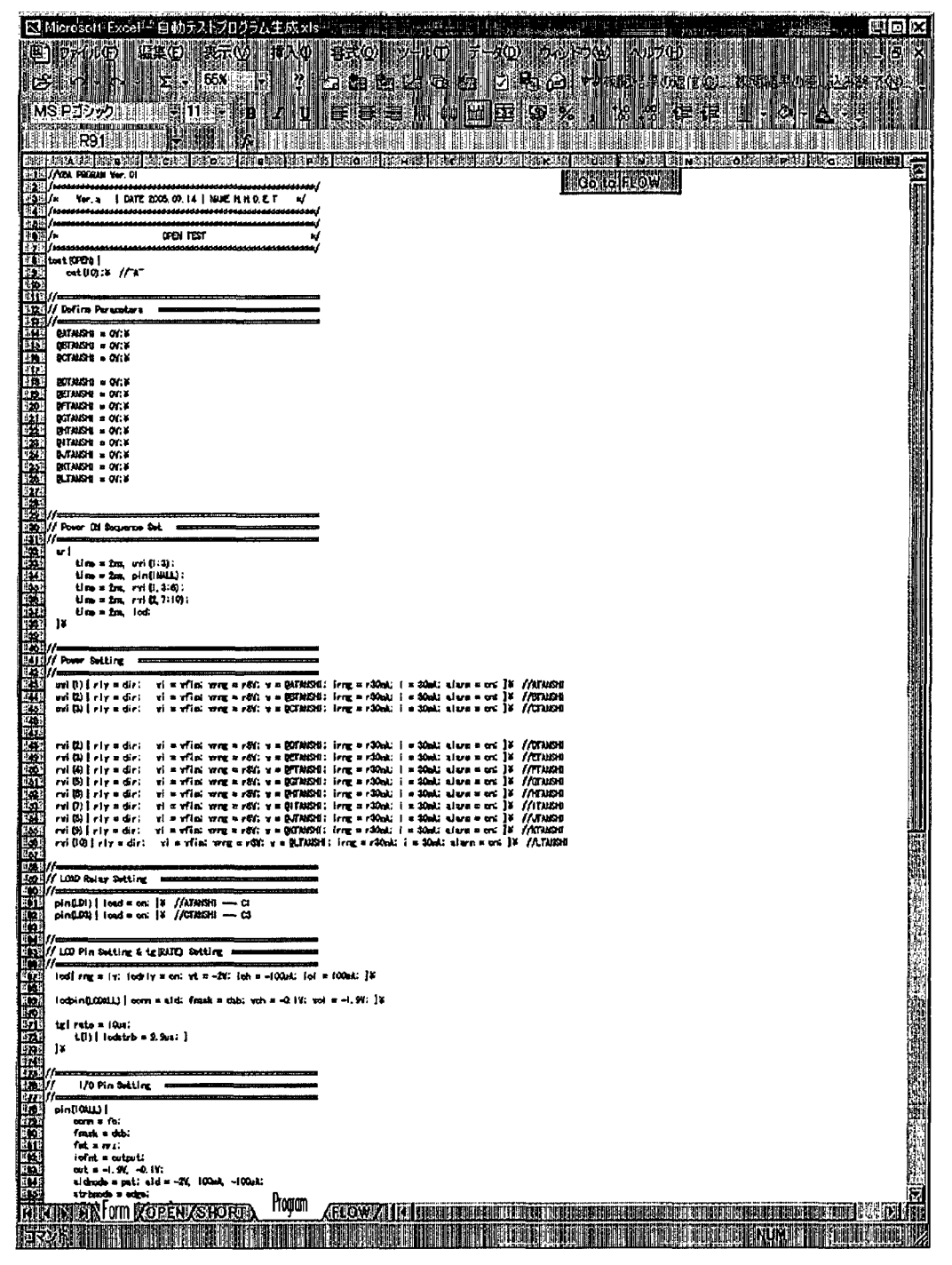

FIG. 15 is a schematic view of an example of the program sheet; the program sheet shows an example of the test program after the executing button in the program-generating sheet is clicked during the open test of FIG. 13. As shown in the embodiment, only the specified test sheet is opened, the specified numerical values are input, and the executing button is operated, the specified test program can be created in the specified program sheet.

In the embodiment, the short test and open test program-generating sheet is set as examples for illustration, but other program-generating sheets corresponding to various test programs can also be prepared.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of generating a test program, for operating a semiconductor testing apparatus operate, the method comprising:

starting a spreadsheet software, wherein a spreadsheet having a plurality of sheets is provided, and each sheet is constructed with a specified format for test conditions to be inputted to the sheet, and at least one of the sheets corresponds to each test item;

selecting one of the sheets from the spreadsheet;

inputting a specified setting condition into the format of the selected sheet;

executing a macroprogram of the spreadsheet software; and generating the test program for operating the semiconductor testing apparatus corresponding to the execution of the macroprogram, wherein the sheet constructed with the specified format comprises set items that include:

a first power source set portion and a second power source set portion, comprising a power source set portion, an applied condition set portion, and a mode set portion, wherein the power source set portion inputs a pin name, the applied condition set portion inputs a setting condition of voltage with an unit volt, and the mode set portion selectively sets in a "vfim" or an "ifvm" mode;

a test rate set portion, comprising an input condition set portion, and an unit set portion, wherein the input condition set portion inputs values corresponding to rates "rt1" to "rt6" respectively, and the unit set portion sets units of the test rate as nanosecond, microsecond, or millisecond;

a relay set portion, comprising an on/off set portion of a load relay number item;

an input pin voltage set portion, comprising an input pin set portion, a Vcc flag set portion, a conn set portion, a fmask set portion, a fmt set portion, and an iofmt set portion, wherein the input pin set portion sets the pin name, the VCC flag set portion sets a power source mode of each terminal as IOVCC, VCC, and VDD, the conn set portion sets a connecting object of each terminal as fc, open, svi, and pmu, the fmask set portion sets a fail mask as dsb and enb, the fmt set portion sets a waveform format as nrz, rl, rz, fixh, fixl, sbc, and the iofmt set portion sets an IO format as input, output, and nrz;

an input pin timing set portion, comprising items setting unit for a first to a sixth timing "tt1-tt6";

an LCD set portion, comprising a mg set portion, a lcdrly set portion, a vt volt set portion, an ioh microampere set portion, and an iol microampere set portion, wherein the mg set portion sets off, lv, and hv as a scope of an LCD pin, the lcdrly set portion sets an "on" and an "off" of an output relay of the LCD pin, the vt volt set portion sets vt of the LCD pin as a unit volt, and the ioh microampere set portion and the iol microampere set portion set a current value of the LCD pin as a unit of microampere;

a lodstrb set portion, setting a strobling of the LCD pins corresponding to the first to the sixth timing "tt1-tt6";

an output pin set portion, comprising an LCD pin set portion, a conn set portion, a fmask set portion, a voh volt set portion, and a vol volt set portion, wherein the LCD pin set portion sets a pin name defined by a DDF file, the conn set portion sets open, ald, and pmu as the connecting object of each terminal, the fmask set portion sets dsb and enb as the fail mask, and the voh volt set portion and the vol volt set portion sets a voltage value as a unit volt;

an IOVCC magnification set portion, setting a magnification in each DC characteristic of VIH1, VIL1, VOH1, VOL1, and VT1;

a VCC magnification set portion, setting a magnification in each DC characteristic of VIH2, VIL2, VOH2, VOL2, and VT2; and a VDD set portion, setting a magnification in each DC characteristic of VIH3, VIL3, VOH3, VOL3, and VT3.

2. The method of generating the test program as claimed in claim 1, wherein the plurality of sheets is created according to a prepared basic sheet.

3. The method of generating the test program as claimed in claim 1, wherein MICROSOFT EXCEL® is used as the spreadsheet.

4. The method of generating the test program as claimed in claim 1, wherein the test program generated by executing the macroprogram is displayed in another sheet in the spreadsheet.

5. The method of test program generation as claimed in claim 1, wherein the sheet constructed with the specified format further comprises the following set items:

a pattern set portion, comprising a test number set portion for setting a test number, a used pattern set portion for setting a used pattern name, a start set portion for setting a start mark recorded in the used pattern, an end set portion for setting an end mark recorded in the used pattern, an operation mode set portion for setting any one of seq/para as an operation mode of the used pattern, and a test pattern condition set portion for setting a number corresponding to a test pattern condition sheet;

a power source sequence set portion, comprising a time set portion for setting sr sequence time with a unit millisecond, a uvi set portion, a rvi set portion, and a pin set portion for setting a terminal name, and various set items of the LCD set portion for setting lcd related to the LCD portion;

a test pattern condition sheet, for setting a condition content corresponding to each test comprising a condition number, a test number, and a pattern name; and a history sheet, for setting history of a test condition sheet.

* * * * *